United States Patent [19]
Koga et al.

[11] Patent Number: 5,986,766
[45] Date of Patent: Nov. 16, 1999

[54] ALIGNMENT METHOD AND ALIGNMENT SYSTEM

[75] Inventors: Shinichiro Koga, Utsunomiya; Shigeyuki Uzawa, Tokyo, both of Japan

[73] Assignee: Canon Kabushiki Kaisha, Tokyo, Japan

[21] Appl. No.: 08/796,556

[22] Filed: Feb. 6, 1997

[30] Foreign Application Priority Data

Feb. 9, 1996 [JP] Japan ................................ 8-046874

[51] Int. Cl.$^6$ .................................................. G01B 11/00
[52] U.S. Cl. ........................... 356/401; 356/375; 356/373; 356/399
[58] Field of Search ................................ 356/401, 375, 356/373, 399

[56] References Cited

U.S. PATENT DOCUMENTS

| | | |
|---|---|---|
| 5,008,703 | 4/1991 | Kawakami et al. . |
| 5,112,133 | 5/1992 | Kurosawa et al. . |
| 5,131,022 | 7/1992 | Terashima et al. . |
| 5,138,643 | 8/1992 | Sakamoto et al. . |
| 5,142,156 | 8/1992 | Ozawa et al. . |
| 5,150,391 | 9/1992 | Ebinuma et al. . |
| 5,172,402 | 12/1992 | Mizusawa et al. . |
| 5,182,615 | 1/1993 | Kurosawa et al. . |
| 5,285,488 | 2/1994 | Watanabe et al. . |
| 5,317,615 | 5/1994 | Ebinuma et al. . |
| 5,499,099 | 3/1996 | Sato et al. . |
| 5,543,921 | 8/1996 | Uzawa et al. . |
| 5,585,925 | 12/1996 | Sato et al. . |
| 5,726,757 | 3/1998 | Kato et al. ........................... 356/401 |
| 5,731,113 | 3/1998 | Uono ..................................... 356/401 |
| 5,751,404 | 5/1998 | Murakami et al. .................... 356/401 |

*Primary Examiner*—Frank G. Font
*Assistant Examiner*—Reginald A. Ratiff
*Attorney, Agent, or Firm*—Fitzpatrick, Cella, Harper & Scinto

[57] ABSTRACT

Disclosed is an alignment method which includes measuring a deviation between a design position and a measurement position, with respect to some of plural alignment execution points upon an object, to be examined, which alignment execution points have predetermined design positions, respectively, applying design positions of some alignment execution points and measured positional deviations to an approximation formula which approximates the relation between design positions and corrected positional deviations, and determining, with respect to each alignment execution point, a correction formula for calculating a corrected positional deviation on the basis of its design position, and performing an alignment procedure to be done with respect to the alignment execution points in accordance with the determined correction formula, wherein the correction formula includes a second or higher order term of design position.

11 Claims, 10 Drawing Sheets

ALIGNMENT METHOD AND ALIGNMENT SYSTEM

FIELD OF THE INVENTION AND RELATED ART

This invention relates to an alignment method and alignment system and, more particularly, an alignment method and alignment system suitably usable in an apparatus which requires use of precise alignment means, such as an exposure apparatus for manufacture of semiconductor devices, for example, for precisely aligning an original (mask or reticle) with a substrate (semiconductor wafer).

Recent further miniaturization in size of and increases in density of a semiconductor integrated circuit such as an IC or LSI has forced further improvements in precision of and addition of function a semiconductor exposure apparatus. Particularly, as regards alignment operation, a technology for enabling registration of an original and a substrate with an order of several tens of nanometers has been expected.

As for exposure apparatuses for use in such semiconductor manufacture, in many cases an apparatus called a stepper or a step-and-scan apparatus is used. In this type of apparatus, a pattern formed on an original (reticle, for example) is sequentially transferred onto different zones on a substrate (semiconductor wafer, for example) while moving the substrate stepwise. An apparatus in which the pattern transfer is executed at once is called a stepper, while an apparatus in which it is executed while scanningly moving a stage is called a step-and-scan exposure apparatus. The difference between them resides in the procedure at the time as the exposure is executed. They have the same operational feature in the point of basic operation (step-and-repeat operation) wherein pattern transfer is repeated while repeating stepwise motion.

As regards alignment procedure for an original and a substrate in a semiconductor exposure apparatus, there are a die-by-die alignment method and a global alignment method. In the former, for each exposure, measurement of an exposure position is executed. In the latter, position measurement is performed beforehand with respect to plural measurement points of a suitable number, and alignment operation is made in accordance with a correction formula prepared on the basis of the measurements. The global alignment method has an advantage of high throughput and high alignment precision, and the alignment procedure based on the same correction formula is performed over the whole area of the substrate. It is convenient in use since, for example, the state of alignment can be discriminated by analyzing measurements at a few points on the substrate.

Here, an alignment method based on global method will be briefly explained. In global alignment method, from a design exposure position $(x, y)$ and in accordance with the following correction formula, a deviation $(d_x', d_y')$ is determined, and alignment and exposure operation is performed:

$$d_x' = a_{00} + a_{10}x + a_{01}y$$
$$d_y' = b_{00} + b_{10}x + b_{01}y \quad (2)$$

where $a_{00}$ and $b_{00}$ are parallel deviations in X and Y directions, respectively, of a wafer as a whole, $a_{10}$ and $b_{10}$ are elongations in X and Y directions, respectively, of the wafer, $a_{01}$ and $b_{01}$ are rotational deviations of X and Y axes, respectively, of shot layout. These coefficients (hereinafter "correction parameters") may be determined by measuring positional deviations at suitable number of measurement points beforehand and by applying the results to an approximation equation like equation (2). It can be done, for example, by using a least square method and in the manner described below.

If the positions of design measurement points are denoted by $(x_i, y_i)$ and the measurement point positions after they are corrected are denoted by $(d_{xi}', d_{yi}')$ (where i denotes each measurement point, wherein $i=0, \ldots, k$ ($k \geq 6$)), then the square sum of errors at the measurement points after being corrected is:

$$E = \sum_{i=0}^{k} [(d_{xi}' - d_{xi})^2 + (d_{yi}' - d_{yi})^2] \quad (3)$$

$$= \sum_{i=0}^{k} [(a_{00} + a_{10}x_i + a_{01}y_i - d_{xi})^2 + (b_{00} + b_{10}x_i + b_{01}y_i - d_{yi})^2]$$

Determining those $a_{00}, a_{10}, a_{01}, b_{00}, b_{10}$ and $b_{01}$ that minimize E, in accordance with the following normal equations, the resultants are taken as values of $a_{00}, a_{10}, a_{01}, b_{00}, b_{10}$ and $b_{01}$, respectively.

The normal equations are:

$$\partial E/\partial a_{00} = 0$$
$$\partial E/\partial a_{10} = 0$$
$$\partial E/\partial a_{01} = 0$$
$$\partial E/\partial b_{00} = 0$$
$$\partial E/\partial b_{10} = 0$$
$$\partial E/\partial b_{01} = 0 \quad (4)$$

Namely, $$\begin{bmatrix} \sum 1 & \sum x_i & \sum y_i \\ \sum x_i & \sum x_i^2 & \sum x_i y_i \\ \sum y_i & \sum x_i y_i & \sum y_i^2 \end{bmatrix} \begin{bmatrix} a_{00} \\ a_{10} \\ a_{01} \end{bmatrix} = \begin{bmatrix} \sum d_{xi} \\ \sum x_i d_{xi} \\ \sum y_i d_{xi} \end{bmatrix} \quad (5)$$

$$\begin{bmatrix} \sum 1 & \sum x_i & \sum y_i \\ \sum x_i & \sum x_i^2 & \sum x_i y_i \\ \sum y_i & \sum x_i y_i & \sum y_i^2 \end{bmatrix} \begin{bmatrix} b_{00} \\ b_{10} \\ b_{01} \end{bmatrix} = \begin{bmatrix} \sum d_{yi} \\ \sum x_i d_{yi} \\ \sum y_i d_{yi} \end{bmatrix}$$

where $\Sigma$ represents $$\sum_{i=0}^{k}$$

(this applies to the rest).

Solutions for these normal equations are:

$$a_{00} = (C_{14}C_{16}D_{11} - C^2_{15}D_{11} + C_{13}C_{15}D_{12} - C_{12}C_{16}D_{12} + C_{12}C_{15}D_{13} - C_{13}C_{14}D_{13})/H_1$$

$$a_{10} = (C_{13}C_{15}D_{11} - C_{12}C_{16}D_{11} + C_{11}C_{16}D_{12} - C^2_{13}D_{12} + C_{12}C_{13}D_{13} - C_{11}C_{15}D_{13})/H_1$$

$$a_{01} = (C_{12}C_{15}D_{11} - C_{13}C_{14}D_{11} + C_{12}C_{13}D_{12} - C_{11}C_{15}D_{12} + C_{11}C_{14}D_{13} - C^2_{12}D_{13})/H_1$$

$b_{00}=(C_{14}C_{16}G_{11}-C^2_{15}G_{11}+C_{13}C_{15}G_{12}-$ $C_{12}C_{16}G_{12}+C_{12}C_{15}G_{13}-C_{13}C_{14}G_{13})/H_1$ $b_{10}=(C_{13}C_{15}G_{11}-C_{12}C_{16}G_{11}+C_{11}C_{16}G_{12}-$ $C^2_{13}G_{12}+C_{12}C_{13}G_{13}-C_{11}C_{15}G_{13})/H_1$ $b_{01}=(C_{12}C_{15}G_{11}-C_{13}C_{14}G_{11}+C_{12}C_{13}G_{12}-$ $C_{11}C_{15}G_{12}+C_{11}C_{14}G_{13}-C^2_{12}G_{13})/H_1$ (6)

wherein $C_{11}=\Sigma 1$ $C_{12}=\Sigma x_i$ $C_{13}=\Sigma y_i$ $C_{14}=\Sigma x_i^2$ $C_{15}=\Sigma x_i y_i$ $C_{16}=\Sigma y_i^2$ $D_{11}=\Sigma d_{xi}$ $D_{12}=\Sigma x_i d_{xi}$ $D_{13}=\Sigma y_i d_{xi}$ $G_{11}=\Sigma d_{yi}$ $G_{12}=\Sigma x_i d_{yi}$ $G_{13}=\Sigma y_i d_{yi}$ $H_1=C_{11}C_{14}C_{16}-C_{11}C_{15}^2-C_{12}^2C_{16}+2C_{12}C_{13}C_{15}-C_{13}^2C_{14}$ (7)

Here, the correction formula of equation (2) is a linear equation wherein translation, rotation and expansion/contraction of the wafer are taken as error factors. Conventionally, in a global alignment method, in many cases a correction formula of linear equation such as set forth above is used. This is because sufficient precision, as is in the past, is attainable with correction by linear equation.

SUMMARY OF THE INVENTION

As described above, global alignment method has an advantage of high throughput and high precision and, as is in the past, sufficient precision is attainable with a correction formula using linear equation.

However, with recent increases of alignment precision, an error component having been considered small becomes non-negligible. Typical examples of such error component are a third-order magnification component of a wafer and an arch component of stepwise motion. A semiconductor manufacturing process involves repetition of film formation upon a wafer and, during this procedure, there occurs elongation/contraction of the wafer due to thermal treatment of the same. Usually, first-order component is prevailing. However, there are cases where a third-order component which seems to be produced during flatness-correction to warping of the wafer is observed.

The arch component attributable to flatness of an interferometer mirror can also be a non-negligible error factor particularly when semiconductor exposure apparatuses of different types are used in combination. Such error factor which depends on n-th order ($n \geq 2$) of position could not be corrected by conventional first-order correction formulae. Thus, it is desirable to provide an alignment method which enables correction of such error factors, that is, to provide an alignment procedure based on a correction formula including high order terms.

However, it needs a long calculation time to determine a correction formula including a higher order term, in global alignment method. It may therefore not be practical in an embodiment where high throughput is required. Thus, reducing the amount of calculation in determination of a correction formula is also desired.

It is accordingly an object of the present invention to provide an alignment method and/or an alignment system which enables correction of an error factor which depends on a higher order of position.

It is another object of the present invention to provide a method which enables determination of such correction formula in a practical time.

Briefly, in accordance with an aspect of the present invention, measurements are made to deviation between a design position and a measurement position, with respect to some of plural alignment execution points upon an object, to be examined, which alignment execution points have predetermined design positions, respectively. Design positions of some alignment execution points and measured positional deviations are applied to an approximation formula which approximates the relation between design positions and corrected positional deviations, by which, with respect to each alignment execution point, a correction formula for calculating a corrected positional deviation on the basis of its design position is determined. For alignment procedure to be done with respect to the alignment execution points in accordance with a determined correction formula, a correction formula which includes a second or higher order term of design position is used.

Now, the manner how to determine a correction formula for correcting an error factor which depends on higher order of position, by using a higher order approximation formula, will be explained.

First, a case where there is an error factor in which the X direction of position depends on n-th order and the Y direction depends on m-th order, that is, a case where a correction formula is to be determined on the basis of an approximation formula of n-th order in the X direction and m-th order in the Y direction, will be explained.

From exposure position $(x_i, y_i)$ which is predetermined in design, correction amount $(d_x', d_y')$ is determined in accordance with equation (8) which is a correction formula, as follows:

$d'_x = a_{00} + a_{10}x + a_{01}y + a_{20}x^2 + a_{11}xy$ $+ a_{02}y^2 + \ldots + a_{nm}x^n y^m + \ldots$ $d'_y = b_{00} + b_{10}x + b_{01}y + b_{20}x^2 + b_{11}xy$ $+ b_{02}y^2 + \ldots + b_{nm}x^n y^m + \ldots$ (8)

The correction parameters of this correction formula can be determined by applying an approximation formula equivalent to equation (8) to a set of design values $(x_i, y_i)$ of a number k and measured deviations $(d_{xi}, d_{yi})$. Specifically, values of coefficients $a_{nm}$ and $b_{nm}$ can be determined by solving normal equation (9), below, by using a least square method.

$$\begin{bmatrix} \sum 1 & \sum x_i & \sum y_i & \sum x_i^n y_i^m \\ \sum x_i & \sum x_i^2 & \sum x_i y_i & \sum x_i^{n+1} y_i^m \\ \sum y_i & \sum x_i y_i & \sum y_i^2 & \sum x_i^n y_i^{m+1} \\ & & & \vdots \\ \sum x_i^n y_i^m & \sum x_i^{m+1} y_i^n & \sum x_i^m y_i^{n+1} & \vdots \end{bmatrix} \begin{bmatrix} a_{00} \\ a_{10} \\ a_{01} \\ \vdots \\ a_{nm} \end{bmatrix} = \begin{bmatrix} \sum d_{xi} \\ \sum d_{xi} x_i \\ \sum d_{xi} y_i \\ \vdots \\ \sum d_{xi} x_i^n y_i^m \\ \vdots \end{bmatrix} \quad (9)$$

$$\begin{bmatrix} \sum 1 & \sum x_i & \sum y_i & \sum x_i^n y_i^m \\ \sum x_i & \sum x_i^2 & \sum x_i y_i & \sum x_i^{n+1} y_i^m \\ \sum y_i & \sum x_i y_i & \sum y_i^2 & \sum x_i^n y_i^{m+1} \\ & & & \vdots \\ \sum x_i^n y_i^m & \sum x_i^{m+1} y_i^n & \sum x_i^m y_i^{n+1} & \vdots \end{bmatrix} \begin{bmatrix} b_{00} \\ b_{10} \\ b_{01} \\ \vdots \\ b_{nm} \end{bmatrix} = \begin{bmatrix} \sum d_{yi} \\ \sum d_{yi} x_i \\ \sum d_{yi} y_i \\ \vdots \\ \sum d_{yi} x_i^n y_i^m \\ \vdots \end{bmatrix}$$

As regards the method of solving a normal equation, it is general to use a method based on known LU solution or a sweeping method.

Next, alignment procedure in a semiconductor manufacturing apparatus will be considered.

Taking a semiconductor manufacturing apparatus into consideration, there may be correction parameters $a_{nm}$ and $b_{nm}$ wherein $a_{00}$ may denote X-direction translation component, $a_{10}$ may denote X scale, $a_{01}$ may denote Y-axis rotation, $a_{02}$ may denote Y-axis arch, $a_{30}$ denote third-order magnification, $a_{12}$ denote third-order magnification, $b_{00}$ denote Y-direction translation component, $b_{10}$ denote X-axis rotation, $b_{01}$ denote Y scale, $b_{20}$ denote X-axis arch, $b_{21}$ denote third-order magnification, and $b_{03}$ denote third-order magnification. In that occasion, a formula corresponding to equation (8) may be:

$$d'_{xi} = a_{00} + a_{10}x_i + a_{01}y_i + a_{02}y_i^2 + a_{30}x_i^3 + a_{12}x_iy_i^2$$

$$d'_{yi} = b_{00} + b_{10}x_i + b_{01}y_i + b_{20}x_i^2 + b_{21}x_i^2 y_i + b_{03}y_i^3 \quad (10)$$

A normal equation corresponding to equation (10) is such as equation (11), below.

$$\begin{bmatrix} \sum 1 & \sum x_i & \sum y_i & \sum y_i^2 & \sum x_i^3 & \sum x_i y_i^2 \\ \sum x_i & \sum x_i^2 & \sum x_i y_i & \sum x_i y_i^2 & \sum x_i^4 & \sum x_i^2 y_i^2 \\ \sum y_i & \sum x_i y_i & \sum y_i^2 & \sum y_i^3 & \sum x_i^3 y_i & \sum x_i y_i^3 \\ \sum y_i^2 & \sum x_i y_i^2 & \sum y_i^3 & \sum y_i^4 & \sum x_i^3 y_i^2 & \sum x_i y_i^4 \\ \sum x_i^3 & \sum x_i^4 & \sum x_i^3 y_i & \sum x_i^3 y_i^2 & \sum x_i^6 & \sum x_i^4 y_i^2 \\ \sum x_i y_i^2 & \sum x_i^2 y_i^2 & \sum x_i y_i^3 & \sum x_i y_i^4 & \sum x_i^4 y_i^2 & \sum x_i^2 y_i^4 \end{bmatrix} \begin{bmatrix} a_{00} \\ a_{10} \\ a_{01} \\ a_{02} \\ a_{30} \\ a_{12} \end{bmatrix} = \begin{bmatrix} \sum d_{xi} \\ \sum d_{xi} x_i \\ \sum d_{xi} y_i \\ \sum d_{xi} y_i^2 \\ \sum d_{xi} x_i^3 \\ \sum d_{xi} x_i y_i^2 \end{bmatrix} \quad (11)$$

$$\begin{bmatrix} \sum 1 & \sum x_i & \sum y_i & \sum x_i^2 & \sum x_i^2 y_i & \sum y_i^3 \\ \sum x_i & \sum x_i^2 & \sum x_i y_i & \sum x_i^3 & \sum x_i^3 y_i & \sum x_i y_i^3 \\ \sum y_i & \sum x_i y_i & \sum y_i^2 & \sum x_i^2 y_i & \sum x_i^2 y_i^2 & \sum y_i^4 \\ \sum x_i^2 & \sum x_i^3 & \sum x_i^2 y_i & \sum x_i^4 & \sum x_i^4 y_i & \sum x_i^2 y_i^3 \\ \sum x_i^2 y_i & \sum x_i^3 y_i & \sum x_i^2 y_i^2 & \sum x_i^4 y_i & \sum x_i^4 y_i^2 & \sum x_i^2 y_i^4 \\ \sum y_i^3 & \sum x_i y_i^3 & \sum y_i^5 & \sum x_i^2 y_i^3 & \sum x_i^2 y_i^4 & \sum y_i^6 \end{bmatrix} \begin{bmatrix} b_{00} \\ b_{10} \\ b_{01} \\ b_{20} \\ b_{21} \\ b_{03} \end{bmatrix} = \begin{bmatrix} \sum d_{yi} \\ \sum d_{yi} x_i \\ \sum d_{yi} y_i \\ \sum d_{yi} x_i^2 \\ \sum d_{yi} x_i^2 y_i \\ \sum d_{yi} y_i^3 \end{bmatrix}$$

Solving this normal equation in a similar manner as equation (5) or (6), it is possible to determine correction parameters $a_{02}$, $a_{30}$, $a_{12}$, $b_{20}$, $b_{21}$, and $b_{03}$, namely, equation (10) which defines a correction formula.

Now, the manner how to determine a correction formula with decreased calculation amount, will be explained.

As described hereinbefore, in a semiconductor manufacturing apparatus, among the correction parameters mentioned above, correction parameters $a_{00}$, $a_{10}$, $a_{01}$, $b_{00}$, $b_{10}$, and $b_{01}$ of first-order component are dominant. For this reason, if approximation is made first to first-order components only to determine first-order component correction parameters $a_{00}$, $a_{10}$, $a_{01}$, $b_{00}$, $b_{10}$ and $b_{01}$, and if high order component correction parameters are so determined as to minimize the remainder, it is possible to reduce calculation time while retaining precision. Namely, first the parameters $a_{00}$, $a_{10}$, $a_{01}$, $b_{00}$, $b_{10}$ and $b_{01}$ may be determined in accordance with equation (6). Then, by using parameters $a_{00}$, $a_{10}$, $a_{01}$, $b_{00}$, $b_{10}$ and $b_{01}$ determined by equation (6), normal equation such as equation (12) below, that minimizes the remainder of first-order component approximation, may be solved. In this manner, it is possible to determine high order component error factors $a_{02}$, $a_{30}$, $a_{12}$, $b_{20}$, $b_{21}$, and $b_{03}$. That is, $$\begin{bmatrix} \sum y_i^4 & \sum x_i^3 y_i^2 & \sum x_i y_i^4 \\ \sum x_i^3 y_i^2 & \sum x_i^6 & \sum x_i^4 y_i^2 \\ \sum x_i y_i^4 & \sum x_i^4 y_i^2 & \sum x_i^2 y_i^4 \end{bmatrix} \begin{bmatrix} a_{02} \\ a_{30} \\ a_{12} \end{bmatrix} = \quad (12)$$

$$\begin{bmatrix} \sum d_{xi} y_i^2 - a_{00} \sum x_i y_i^2 - a_{10} \sum x_i y_i^2 - a_{01} \sum y_i^3 \\ \sum d_{xi} x_i^3 - a_{00} \sum x_i^3 - a_{10} \sum x_i^4 - a_{01} \sum x_i^3 y_i \\ \sum d_{xi} x_i y_i^2 - a_{00} \sum x_i y_i^2 - a_{10} \sum x_i^2 y_i^2 - a_{01} \sum x_i y_i^3 \end{bmatrix}$$

$$\begin{bmatrix} \sum y_i^4 & \sum x_i^4 y_i & \sum x_i^2 y_i^3 \\ \sum x_i^4 y_i & \sum x_i^4 y_i^2 & \sum x_i^2 y_i^4 \\ \sum x_i^2 y_i^3 & \sum x_i^2 y_i^4 & \sum y_i^6 \end{bmatrix} \begin{bmatrix} b_{02} \\ b_{21} \\ b_{03} \end{bmatrix} =$$

$$\begin{bmatrix} \sum d_{yi} x_i^2 - b_{00} \sum x_i^2 - b_{10} \sum x_i^3 - b_{01} \sum x_i^2 y_i \\ \sum d_{yi} x_i^2 y_i - b_{00} \sum x_i^2 y_i - b_{10} \sum x_i^3 y_i - b_{01} \sum x_i^2 y_i^2 \\ \sum d_{yi} x_i y_i^3 - b_{00} \sum y_i^3 - b_{10} \sum x_i y_i^3 - b_{01} \sum y_i^5 \end{bmatrix}$$

Solutions for this normal equation are:

$a_{02}=(C_{24}C_{26}D_{21}-C^2{}_{25}D_{21}+C_{23}C_{25}D_{22}-$
$C_{22}C_{26}D_{22}+C_{22}C_{25}D_{23}-C_{23}C_{24}D_{23})/H_2$ $a_{30}=(C_{23}C_{25}D_{21}-C_{22}C_{26}D_{21}+C_{21}C_{26}D_{22}-$
$C^2{}_{23}D_{22}+C_{22}C_{23}D_{23}-C_{21}C_{25}D_{23})/H_2$ $a_{12}=(C_{22}C_{25}D_{21}-C_{23}C_{24}D_{21}+C_{22}C_{23}D_{22}-$
$C_{21}C_{25}D_{22}+C_{21}C_{24}D_{23}-C^2{}_{22}D_{23})/H_2$ $b_{20}=(F_{14}F_{16}G_{11}-F^2{}_{15}G_{11}+F_{13}F_{15}G_{12}-$
$F_{12}F_{16}G_{12}+F_{12}F_{15}G_{13}-F_{13}F_{14}G_{13})/I_2$ $b_{21}=(F_{13}F_{15}G_{11}-F_{12}F_{16}G_{11}+F_{11}F_{16}G_{12}-$
$F^2{}_{13}G_{12}+F_{12}F_{13}G_{13}-F_{11}F_{15}G_{13})/I_2$ $b_{03}=(F_{12}F_{15}G_{11}-F_{13}F_{14}G_{11}+F_{12}F_{13}G_{12}-$
$F_{11}F_{15}G_{12}+F_{11}F_{14}G_{13}-F^2{}_{12}G_{13})/I_2$ (13)

wherein $C_{21}=\Sigma y_i^4$ $C_{22}=\Sigma x_i^3 y_i^2$ $C_{23}=\Sigma x_i y_i^4$ $C_{24}=\Sigma x_i^6$ $C_{25}=\Sigma x_i^4 y_i^2$ $C_{26}=\Sigma x_i^2 y_i^4$ $D_{21}=\Sigma d_{xi} y_i^2 - a_{00}\Sigma y_i^2 - a_{10}\Sigma x_i y_i^2 - a_{01}\Sigma y_i^3$ $D_{22}=\Sigma d_{xi} x_i^3 - a_{00}\Sigma x_i^3 - a_{10}\Sigma x_i^4 - a_{01}\Sigma x_i^3 y_i$ $D_{23}=\Sigma d_{xi} x_i y_i^2 - a_{00}\Sigma x_i y_i^2 - a_{10}\Sigma x_i^2 y_i^2 - a_{01}\Sigma x_i y_i^3$ $F_{21}=\Sigma x_i^4$ $F_{22}=\Sigma x_i^4 y_i$ $F_{23}=\Sigma x_i^2 y_i^3$ $F_{24}=\Sigma x_i^4 y_i^2$ $F_{25}=\Sigma x_i^2 y_i^4$ $F_{26}=\Sigma y_i^6$ $G_{21}=\Sigma d_{yi} x_i^2 - b_{00}\Sigma x_i^2 - b_{10}\Sigma x_i^3 - b_{01}\Sigma x_i^2 y_i$ $G_{22}=\Sigma d_{yi} x_i^2 y_i - b_{00}\Sigma x_i^2 y_i - b_{10}\Sigma x_i^3 y_i - b_{01}\Sigma x_i^2 y_i^2$ $G_{23}=\Sigma d_{yi} y_i^3 - b_{00}\Sigma y_i^3 - b_{10}\Sigma x_i y_i^3 - b_{01}\Sigma y_i^5$ $H_2=C_{21}C_{24}C_{26}-C_{21}C^2{}_{25}-C^2{}_{22}C_{26}+2C_{22}C_{23}C_{25}-C^2{}_{23}C_{24}$ $I_2=F_{21}F_{24}F_{26}-F_{21}F^2{}_{25}-F^2{}_{22}F_{26}+2F_{22}F_{23}F_{25}-F^2{}_{23}F_{24}$ (14)

Next, another example of determining a correction formula with reduced calculation amount will be explained.

In semiconductor device manufacturing apparatuses, it is considered that, if the same system or apparatus is used, variation in high order component error factor is small. For this reason, there may be a method of reducing calculation amount by using a value or values in already executed alignment procedure, for high order component error factors of alignment. More specifically, correction parameters $a_{02}$, $a_{30}$, $a_{12}$, $b_{20}$, $b_{21}$ and $b_{03}$ for high order component error factors may be taken as being those values having been determined in preceding alignment procedure, such as $$\overline{a_{02}}, \overline{a_{30}}, \overline{a_{12}}, \overline{b_{20}}, \overline{b_{21}}, \overline{b_{03}}$$

and, based on this, a correction formula may be determined.

For example, averages of correction parameters determined with respect to first several wafers, in accordance with equation (15), may be used as correction parameters of high order component error factors.

$$\overline{a_{02}} = \left(\sum_{j=1}^{l} a_{02j}\right)/l \quad (15)$$

$$\overline{a_{30}} = \left(\sum_{j=1}^{l} a_{30j}\right)/l$$

$$\overline{a_{12}} = \left(\sum_{j=1}^{l} a_{12j}\right)/l$$

$$\overline{b_{20}} = \left(\sum_{j=1}^{l} b_{20j}\right)/l$$

$$\overline{b_{21}} = \left(\sum_{j=1}^{l} b_{21j}\right)/l$$

$$\overline{b_{03}} = \left(\sum_{j=1}^{l} b_{03j}\right)/l$$

wherein j denotes a wafer with respect to which alignment procedure has been done. The correction parameters as determined with respect to a first wafer (j=1) may be used for a second wafer and wafers following it. Here, parameters $a_{00}$, $a_{10}$, $a_{01}$, $b_{00}$, $b_{10}$ and $b_{01}$ may be determined by solving a normal equation such as equation (16) below.

$$\begin{bmatrix} \sum 1 & \sum x_i & \sum y_i \\ \sum x_i & \sum x_i^2 & \sum x_i y_i \\ \sum y_i & \sum x_i y_i & \sum y_i^2 \end{bmatrix} \begin{bmatrix} a_{00} \\ a_{10} \\ a_{01} \end{bmatrix} = \tag{16}$$

$$\begin{bmatrix} \sum d_{xi} - a_{02} \sum y_i^2 - a_{30} \sum x_i^3 - a_{12} \sum x_i y_i^2 \\ \sum d_{xi} x_i - a_{02} \sum x_i y_i^2 - a_{30} \sum x_i^4 - a_{12} \sum x_i^2 y_i^2 \\ \sum d_{xi} y_i - a_{02} \sum y_i^3 - a_{30} \sum x_i^3 y_i - a_{12} \sum x_i y_i^3 \end{bmatrix}$$

$$\begin{bmatrix} \sum 1 & \sum x_i & \sum y_i \\ \sum x_i & \sum x_i^2 & \sum x_i y_i \\ \sum y_i & \sum x_i y_i & \sum y_i^2 \end{bmatrix} \begin{bmatrix} b_{00} \\ b_{10} \\ b_{01} \end{bmatrix} =$$

$$\begin{bmatrix} \sum d_{yi} - b_{20} \sum x_i^2 - b_{21} \sum x_i^2 y_i - b_{03} \sum y_i^3 \\ \sum d_{yi} x_i - b_{20} \sum x_i^3 - b_{21} \sum x_i^3 y_i - b_{03} \sum x_i y_i^3 \\ \sum d_{yi} y_i - b_{20} \sum x_i^2 y - b_{21} \sum x_i^2 y_i^2 - b_{03} \sum y_i^4 \end{bmatrix}$$

Solutions for this normal equation are:

$a_{00} = (C_{34}C_{36}D_{31} - C^2{}_{35}D_{31} + C_{33}C_{35}D_{32} -$
$C_{32}C_{36}D_{32} + C_{32}C_{35}D_{33} - C_{33}C_{34}D_{33})/H_3$ $a_{10} = (C_{33}C_{35}D_{31} - C_{32}C_{36}D_{31} + C_{31}C_{36}D_{32} -$
$C^2{}_{33}D_{32} + C_{32}C_{33}D_{33} - C_{31}C_{35}D_{33})/H_3$ $a_{01} = (C_{32}C_{35}D_{31} - C_{33}C_{34}D_{31} + C_{32}C_{33}D_{32} -$
$C_{31}C_{35}D_{32} + C_{31}C_{34}D_{33} - C^2{}_{32}D_{33})/H_3$ $b_{00} = (C_{34}C_{36}G_{31} - C^2{}_{35}G_{31} + C_{33}C_{35}G_{32} -$
$C_{32}C_{36}G_{32} + C_{32}C_{35}G_{33} - C_{33}C_{34}G_{33})/H_3$ $b_{10} = (C_{33}C_{35}G_{31} - C_{32}C_{36}G_{31} + C_{31}C_{36}G_{32} -$
$C^2{}_{33}G_{32} + C_{32}C_{33}G_{33} - C_{31}C_{35}G_{33})/H_3$ $b_{01} = (C_{32}C_{35}G_{31} - C_{33}C_{34}G_{31} + C_{32}C_{33}G_{32} -$
$C_{31}C_{35}G_{32} + C_{31}C_{34}G_{33} - C^2{}_{32}G_{33})/H_3$ \tag{17} wherein $C_{31} = \Sigma 1$ $C_{32} = \Sigma x_i$ $C_{33} = \Sigma y_i$ $C_{34} = \Sigma x_i^2$ $C_{35} = \Sigma x_i y_i$ $C_{36} = \Sigma y_i^2$ $D_{31} = \Sigma d_{xi} - a_{02} \Sigma y_i^2 - a_{30} \Sigma x_i^3 - a_{12} \Sigma x_i y_i^2$ $D_{32} = \Sigma d_{xi} x_i - a_{02} \Sigma x_i y_i^2 - a_{30} \Sigma x_i^4 - a_{12} \Sigma x_i^2 y_i^2$ $D_{33} = \Sigma d_{xi} y_i - a_{02} \Sigma y_i^3 - a_{30} \Sigma x_i^3 y_i - a_{12} \Sigma x_i y_i^3$ $G_{31} = \Sigma d_{yi} - b_{20} \Sigma x_i^2 - b_{21} \Sigma x_i^2 y_i - b_{03} \Sigma y_i^3$ $G_{32} = \Sigma d_{yi} x_i - b_{20} \Sigma x_i^3 - b_{21} \Sigma x_i^3 y_i - b_{03} \Sigma x_i y_i^3$ $G_{33} = \Sigma d_{yi} y_i - b_{20} \Sigma x_i^2 y_i - b_{21} \Sigma x_i^2 y_i^2 - b_{03} \Sigma y_i^4$ $H_3 = C_{31}C_{34}C_{36} - C_{31}C^2{}_{35} - C^2{}_{32}C_{36} + 2C_{32}C_{33}C_{35} - C^2{}_{33}C_{34}$ \tag{18}

A further example of determining a correction formula with reduced calculation amount, will now be explained.

Without directly using values determined from correction parameters of an already performed alignment procedure, as being correction parameters for subsequent wafers, a ratio between correction parameters for first-order component error factor and for higher-order component error factor may be used as a value for subsequent wafers. This may assure higher precision as compared with the example described above. More specifically, among higher-order component error factors, $a_{12}$ and $b_{21}$ (third order magnification), $a_{02}$ (Y-axis arch component), and $b_{20}$ (X-axis arch component) may be fixed in a particular system, although $a_{30}$ and $b_{03}$ (third order magnification) may be variable in accordance with $a_{10}$ (X scale) and $b_{01}$ (Y scale). In consideration of this, ratios of the third order magnifications $a_{30}$ and $b_{03}$ to the X scale $a_{10}$ and Y scale $b_{01}$ are calculated as follows:

$A = \overline{a_{30}}/\overline{a_{10}}$ $B = \overline{b_{03}}/\overline{b_{01}}$ wherein $$\overline{a_{10}} = \left( \sum_{i=0}^{l-1} a_{10j} \right) / l \tag{19}$$

$$\overline{b_{01}} = \left( \sum_{i=0}^{l-1} b_{01j} \right) / l$$

Then, parameters $a_{00}$, $a_{10}$, $a_{01}$, $b_{00}$, $b_{10}$ and $b_{01}$ are determined by solving a normal equation such as equation (20) below.

$$\begin{bmatrix} \sum 1 & \sum x_i + A_{30} \sum x_i^3 & \sum y_i \\ \sum x_i & \sum x_i^2 + A_{30} \sum x_i^4 & \sum x_i y_i \\ \sum y_i & \sum x_i y_i + A_{30} \sum x_i^3 y_i & \sum y_i^2 \end{bmatrix} \begin{bmatrix} a_{00} \\ a_{10} \\ a_{01} \end{bmatrix} = \tag{20}$$

$$\begin{bmatrix} \sum d_{xi} - a_{12} \sum x_i y_i^2 - a_{02} \sum y_i^2 \\ \sum d_{xi} x_i - a_{12} \sum x_i^2 y_i^2 - a_{02} \sum x_i y_i^2 \\ \sum d_{xi} y_i - a_{12} \sum x_i y_i^3 - a_{02} \sum y_i^3 \end{bmatrix}$$

$$\begin{bmatrix} \sum 1 & \sum x_i & \sum y_i + B_{03} \sum y_i^3 \\ \sum x_i & \sum x_i^2 & \sum x_i y_i + B_{03} \sum x_i y_i^3 \\ \sum y_i & \sum x_i y_i & \sum x_i^2 y_i^2 + B_{03} \sum y_i^4 \end{bmatrix} \begin{bmatrix} b_{00} \\ b_{10} \\ b_{01} \end{bmatrix} =$$

$$\begin{bmatrix} \sum d_{yi} - b_{20} \sum x_i^2 - b_{21} \sum x_i^2 y_i \\ \sum d_{yi} x_i - b_{20} \sum x_i^3 - b_{21} \sum x_i^3 y_i \\ \sum d_{yi} y_i - b_{20} \sum x_i^2 y_i - b_{21} \sum x_i^2 y_i \end{bmatrix}$$

Solutions for this normal equation are:

$a_{00} = (C_{44}C_{46}D_{41} - C^2{}_{45}D_{41} + C_{43}C_{45}D_{42} -$
$C_{42}C_{46}D_{42} + C_{42}C_{45}D_{43} - C_{43}C_{44}D_{43})/H_4$ $a_{10} = (C_{43}C_{45}D_{41} - C_{42}C_{46}D_{41} + C_{41}C_{46}D_{42} -$
$C^2{}_{43}D_{42} + C_{42}C_{43}D_{43} - C_{41}C_{45}D_{43})/H_4$ $a_{01} = (C_{42}C_{45}D_{41} - C_{43}C_{44}D_{41} + C_{42}C_{43}D_{42} -$ $C_{41}C_{45}D_{42}+C_{41}C_{44}D_{43}-C^2{}_{42}D_{43})/H_4$ $b_{00}=(F_{44}F_{46}G_{41}-F^2{}_{45}G_{41}+F_{43}F_{45}G_{42}-$ $F_{42}F_{46}G_{42}+F_{42}F_{45}G_{43}-F_{43}F_{44}G_{43})/I_4$ $b_{10}=(F_{43}F_{45}G_{41}-F_{42}F_{46}G_{41}+F_{41}F_{46}G_{42}-$ $F^2{}_{43}G_{42}+F_{42}F_{43}G_{43}-F_{41}F_{45}G_{43})/I_4$ $b_{01}=(F_{42}F_{45}G_{41}-F_{43}F_{44}G_{41}+F_{42}F_{43}G_{42}-$ $F_{41}F_{45}G_{42}+F_{41}F_{44}G_{43}-F^2{}_{42}G_{43})/I_4$ (21)

wherein $C_{41}=\Sigma 1$ $C_{42}=\Sigma x_i+A_{30}\Sigma x_i^3$ $C_{43}=\Sigma y_i$ $C_{44}=\Sigma x_i^2+A_{30}\Sigma x_i^4$ $C_{45}=\Sigma x_i y_i$ $C_{46}=\Sigma y_i^2$ $F_{41}=\Sigma 1$ $F_{42}=\Sigma x_i$ $F_{43}=\Sigma y_i+B_{03}\Sigma y_i^3$ $F_{44}=\Sigma x_i^2$ $F_{45}=\Sigma x_i y_i+B_{03}\Sigma x_i y_i^3$ $F_{46}=\Sigma x_i^2 y_i^2+B_{03}\Sigma y_i^4$ $D_{41}=\Sigma d_{xi}-a_{12}\Sigma x_i y_i^2-a_{02}\Sigma y_i^2$ $D_{42}=\Sigma x_i d_{xi}-a_{12}\Sigma x_i^2 y_i^2-a_{02}\Sigma x_i y_i^2$ $D_{43}=\Sigma y_i d_{xi}-a_{12}\Sigma x_i y_i^3-a_{02}\Sigma y_i^3$ $G_{41}=\Sigma d_{yi}-b_{20}\Sigma x_i^2-b_{21}\Sigma x_i^2 y_i$ $G_{42}=\Sigma x_i d_{yi}-b_{20}\Sigma x_i^3-b_{21}\Sigma x_i^3 y_i$ $G_{43}=\Sigma y_i d_{yi}-b_{20}\Sigma x_i^2 y_i-b_{21}\Sigma x_i^2 y_i$ $H_4=C_{41}C_{44}C_{46}-C_{41}C^2{}_{45}-C^2{}_{42}C_{46}+2C_{42}C_{43}C_{45}-C^2{}_{43}C_{44}$ $I_4=F_{41}F_{44}F_{46}-F_{41}F^2{}_{45}-F^2{}_{42}F_{46}+2F_{42}F_{43}F_{45}-F^2{}_{43}F_{44}$ (22)

As described above, an alignment method according to an aspect of the present invention comprises a measuring step for measuring a deviation between a design position and a measurement position, with respect to some of plural alignment execution points upon an object, to be examined, which alignment execution points have predetermined design positions, respectively, a correction formula determining step for applying design positions of some alignment execution points and measured positional deviations to an approximation formula which approximates the relation between design positions and corrected positional deviations, and determining, with respect to each alignment execution point, a correction formula for calculating a corrected positional deviation on the basis of its design position, and an alignment procedure executing step for performing an alignment procedure to be done with respect to the alignment execution points in accordance with the determined correction formula, wherein the correction formula includes a second or higher order term of design position.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
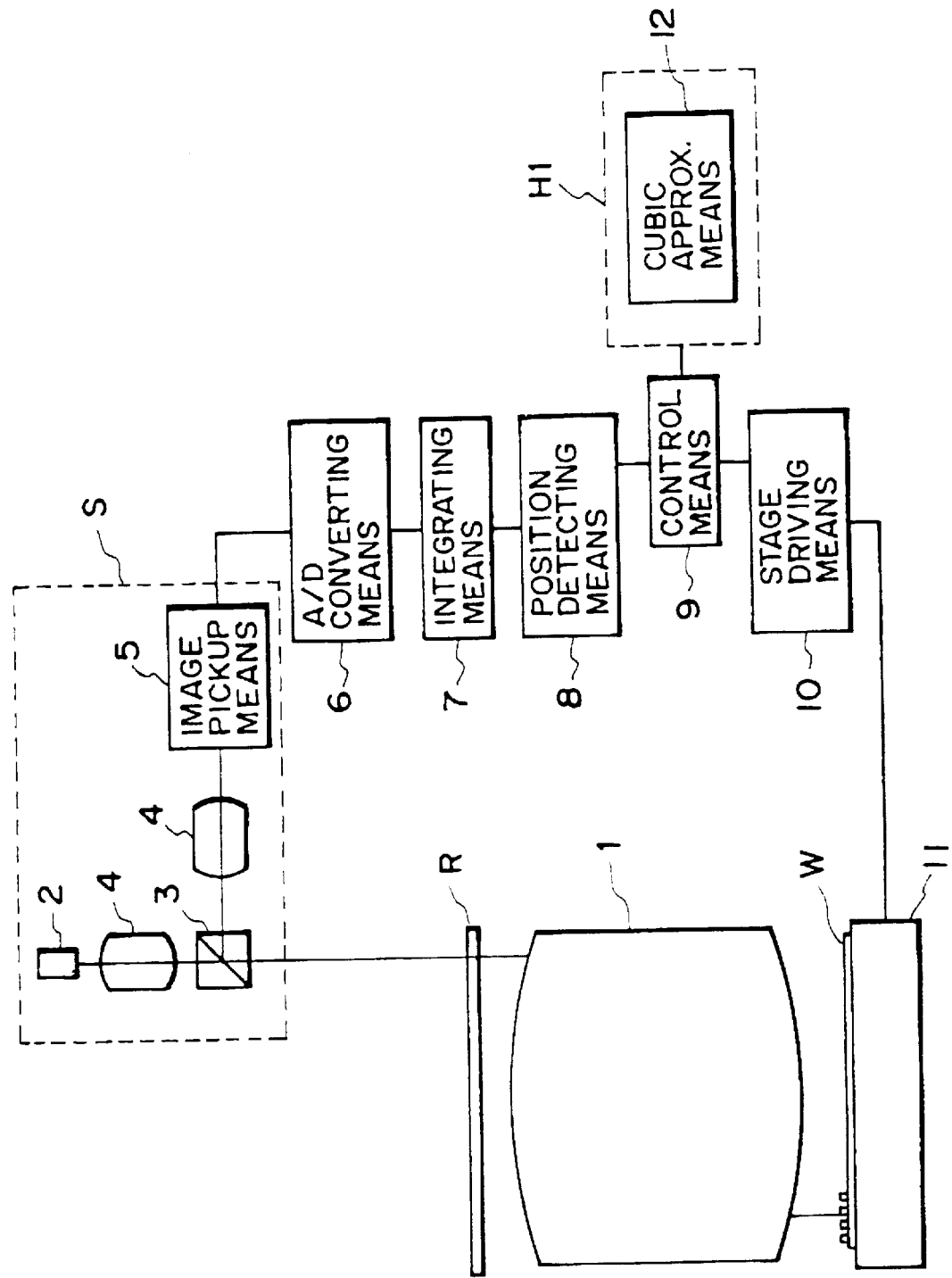
FIG. 1 is a schematic and diagrammatic view of general structure of a semiconductor exposure apparatus according to a first embodiment of the present invention.

FIG. 1 is a schematic view of a first embodiment of the present invention wherein the invention is applied to a step-and-repeat type semiconductor manufacturing exposure apparatus.

Denoted in FIG. 1 at R is a reticle which is an original. Denoted at W is a wafer, and denoted at 1 is a projection optical system. Denoted at S is an alignment optical system, and denoted at 2 is an alignment illumination means. Denoted at 3 is a beam splitter, and denoted at 4 is an imaging optical system. Denoted at 5 is an image pickup means, and denoted at 6 is an analog-to-digital (A/D) converting means. Denoted at 7 is an integrating means, and denoted at 8 is a position detecting means. Denoted at 9 is a control means, and denoted at 10 is a stage driving means. Denoted at 11 is an X-Y stage which is movable two-dimensionally, and denoted at H1 is a correction formula producing means. Denoted at 12 is a third-order approximation means. While in FIG. 1 there is only an alignment optical system S for detection of the position with respect to X direction, the apparatus is equipped with another alignment optical system of similar structure, for detection of the position with respect to Y direction. Also, the integrating means 7, the position detecting means 8, the control means 9 and the correction formula producing means H1 may be provided by functions of a board computer or a general purpose computer, and a common system may be used for them. Of course, separate electronic circuit devices may be used exclusively for them.

Figure 3:
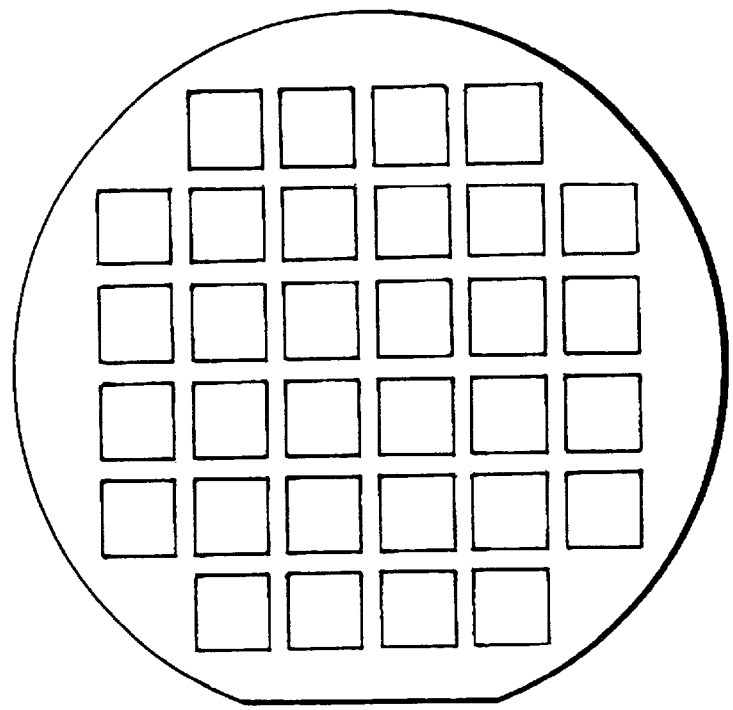
FIG. 3 is a schematic view for explaining an example of exposure regions defined on a wafer.
Figure 4:
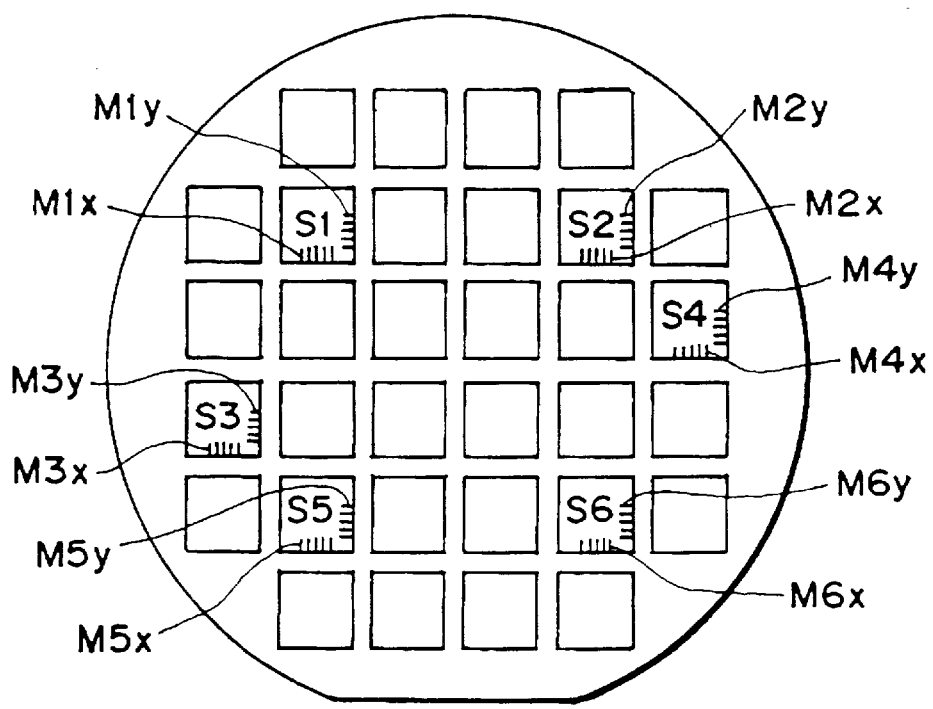
FIG. 4 is a schematic view for explaining an example of those exposure regions to be used in the measurement.

In the semiconductor exposure apparatus shown in FIG. 1, relative alignment between the reticle R and the wafer W is first performed and, thereafter, exposure light is projected from an exposure illumination source (not shown) by which an electronic circuit pattern formed on the reticle R is projected and transferred onto the wafer W, placed on the X-Y stage 11, through the projection optical system 1. FIG. 3 illustrates an example of exposure regions defined on a wafer, and FIG. 4 illustrates an example of those exposure regions to be used in the measurement.

Figure 2:
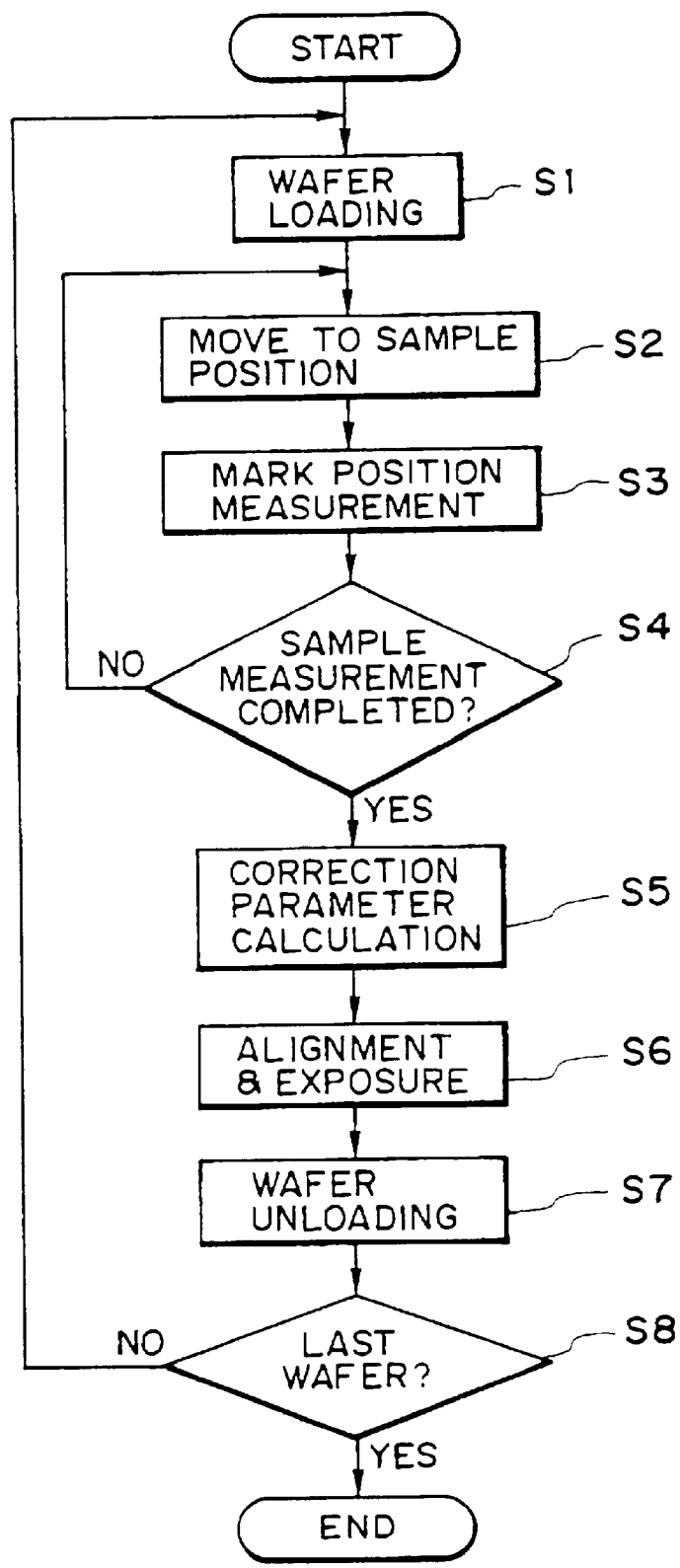
FIG. 2 is a flow chart for explaining an example of alignment and exposure procedure in the apparatus of FIG. 1.

Now, the procedure of relative alignment of the reticle R and the wafer W and exposure of them, in the apparatus of FIG. 1, will be described. FIG. 2 is a flow chart for explaining an example of alignment and exposure procedure to be performed in accordance with a global alignment method. In the following, while referring to FIG. 2, an embodiment of alignment and exposure method as well as the structure therefor will be explained.

First, at step S1, a wafer W is loaded onto the X-Y stage 11 by means of a wafer conveying system (not shown).

At step S2, the control means 9 applies a signal to the stage driving means 10 to move the X-Y stage 11 so that an alignment mark $M_{1x}$ formed in a first measurement shot S1 (FIG. 4) is placed within the view field of the alignment optical system S.

At step S3, the position of the mark $M_{1x}$ is measured in the following manner.

Figure 6:
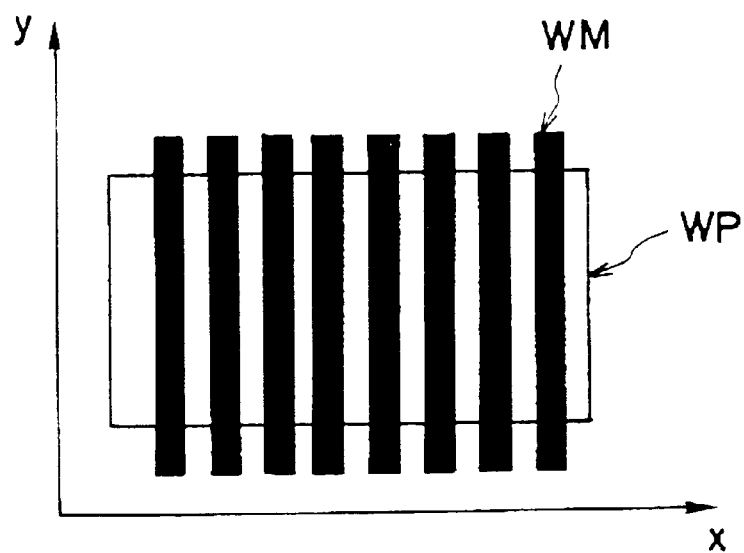
FIG. 6 is a schematic view for explaining an example of measurement mark used in the FIG. 4 example.

First, with the light as projected from the alignment illumination means 2 (which is non-sensitizing light) and through the reticle R and the projection optical system 1, the alignment mark $M_{1x}$ (hereinafter referred also to as "wafer mark") is irradiated. FIG. 6 illustrates this wafer mark $M_{ix}$. As illustrated, it comprises arrayed rectangular patterns of the same configuration. Light reflected by the wafer mark $M_{1x}$ goes through the projection optical system 1 and the reticle R again, and it impinges on the beam splitter 3. The light is reflected by the beam splitter, and then it forms an image $W_M$ of the wafer mark $M_{1x}$ upon an image pickup surface of the image pickup device 5. In this image pickup device 5, the image of the mark $M_{1x}$ is photoelectrically converted into a signal which in turn is transformed into a two-dimensional digital signal train by means of the A/D converting device 6. The integrating means 7 of FIG. 1 serves to define a processing window $W_P$ to the wafer mark image $W_M$ having been digitalized by the A/D converting means 6, and to perform movement averaging processing in Y direction (FIG. 6) in that window such that the two-dimensional imagewise signal is transformed into a one-dimensional digital signal train S(x). The position detecting means 8 of FIG. 1 functions to perform a pattern matching operation to the one-dimensional digital signal train S(x) outputted from the integrating means 7 by using a template pattern having been stored therein, and to apply to the control means 9 an output signal of such coordinate position of S(x) as having highest analogy to the template pattern. Since this output signal represents the position of the mark which is with reference to the image pickup surface of the image pickup device 5, the control means 9 calculates a deviation amount $d_{x1}$ of the wafer mark $M_{1x}$ with respect to the reticle R on the basis of the relative position of the image pickup device 5 and the reticle R, which may be determined beforehand by any known method.

In the manner described above, the positional deviation of the first measurement shot with respect to X direction is measured. Subsequently, the control means 9 operates to move the X-Y stage 11 so that a Y-direction measurement mark $M_{1y}$ of the first measurement shot is placed within the view field of the Y-direction alignment optical system. Then, in a similar procedure as in the X-direction measurement, positional deviation $d_{y1}$ of the mark in the Y direction is measured. With the above, measurement to the measurement shot S1 is completed. After this, the control means 9 operates to successively move the X-Y stage 11 to respective measurement positions and to perform measurements of positional deviations in X and Y directions in a similar manner.

The operations at steps S2 and S3 are repeated until completion of measurements to measurement shots of a predetermined number k (k>6) is concluded at step S4. Measured positional deviations $d_{xi}$ and $d_{yi}$ (i=1, 2, . . . , k) at respective measurement shots are memorized.

At steps S5 and S6, relative alignment of the wafer W to the reticle R is performed on the basis of the positional deviations of the measurement shots, as measured at step S3, in accordance with the following procedure.

Figure 5:
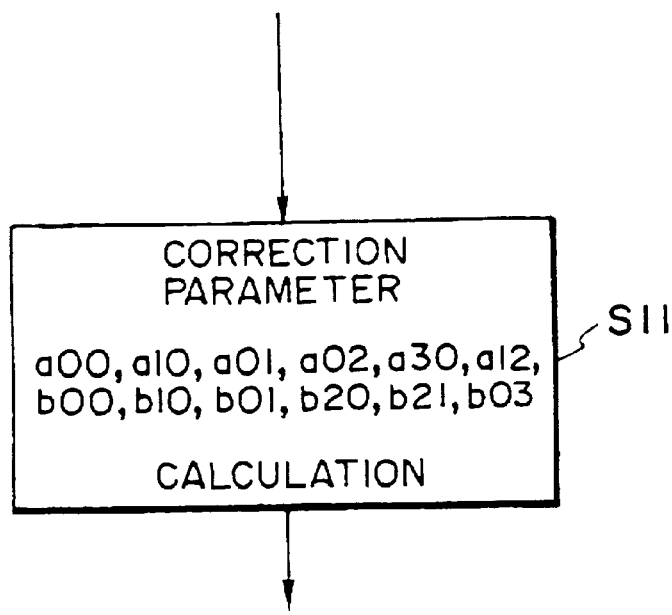
FIG. 5 is a schematic and diagrammatic view for explaining an example of procedure of correction formula determination, in the flow chart of FIG. 2.

At step S5, as illustrated in FIG. 5, the third-order approximation means 12 operates to solve the normal equation (11) on the basis of mark design positions $(x_i, y_i)$ of measurement shots, specified beforehand, and of positional deviations $(d_{xi}, d_{yi})$ of the measurement shots having been measured at step S3, to determine correction parameters $a_{00}$, $a_{10}$, $a_{01}$, $a_{02}$, $a_{30}$, $a_{12}$, $b_{00}$, $b_{10}$, $b_{01}$, $b_{20}$, $b_{21}$ and $b_{03}$ which in turn are applied to the control means 9. Normal equation can be solved in a known manner, such as by a method using LU solution or a sweeping method.

At step S6, the control means 9 operates to calculate correction amount $(d_{xi}', d_{yi}')$ in accordance with equation (10) having coefficients of correction parameters $a_{00}$, $a_{10}$, $a_{01}$, $a_{02}$, $a_{30}$, $a_{12}$, $b_{00}$, $b_{10}$, $b_{01}$, $b_{20}$, $b_{21}$ and $b_{03}$, and to move the X-Y stage 11 in accordance with that value, and exposures of all the shots defined on the wafer W are performed.

At step S7, the wafer W is unloaded from the X-Y stage 11 by means of a wafer conveying system (not shown). The operations from step S1 to step S7 are repeated until completion of exposures to all wafers is concluded at step S8.

By executing alignment procedure in accordance with a correction formula including error factors which depend on higher order of position, as described, enhanced alignment precision is attainable. Further, there is an advantage that the state of alignment can be discriminated from the correction parameters determined during the procedure: that is, X-direction translation component from $a_{00}$, X-scale from $a_{10}$, Y-axis rotation from $a_{01}$, Y-axis arch from $a_{02}$, third-order magnification from $a_{30}$ and $a_{12}$, Y-direction translation component from $b_{00}$, X-axis rotation from $b_{10}$, Y scale from $b_{01}$, X-axis arch from $b_{20}$, and third-order magnification from $b_{21}$ and $b_{03}$.

Figure 7:
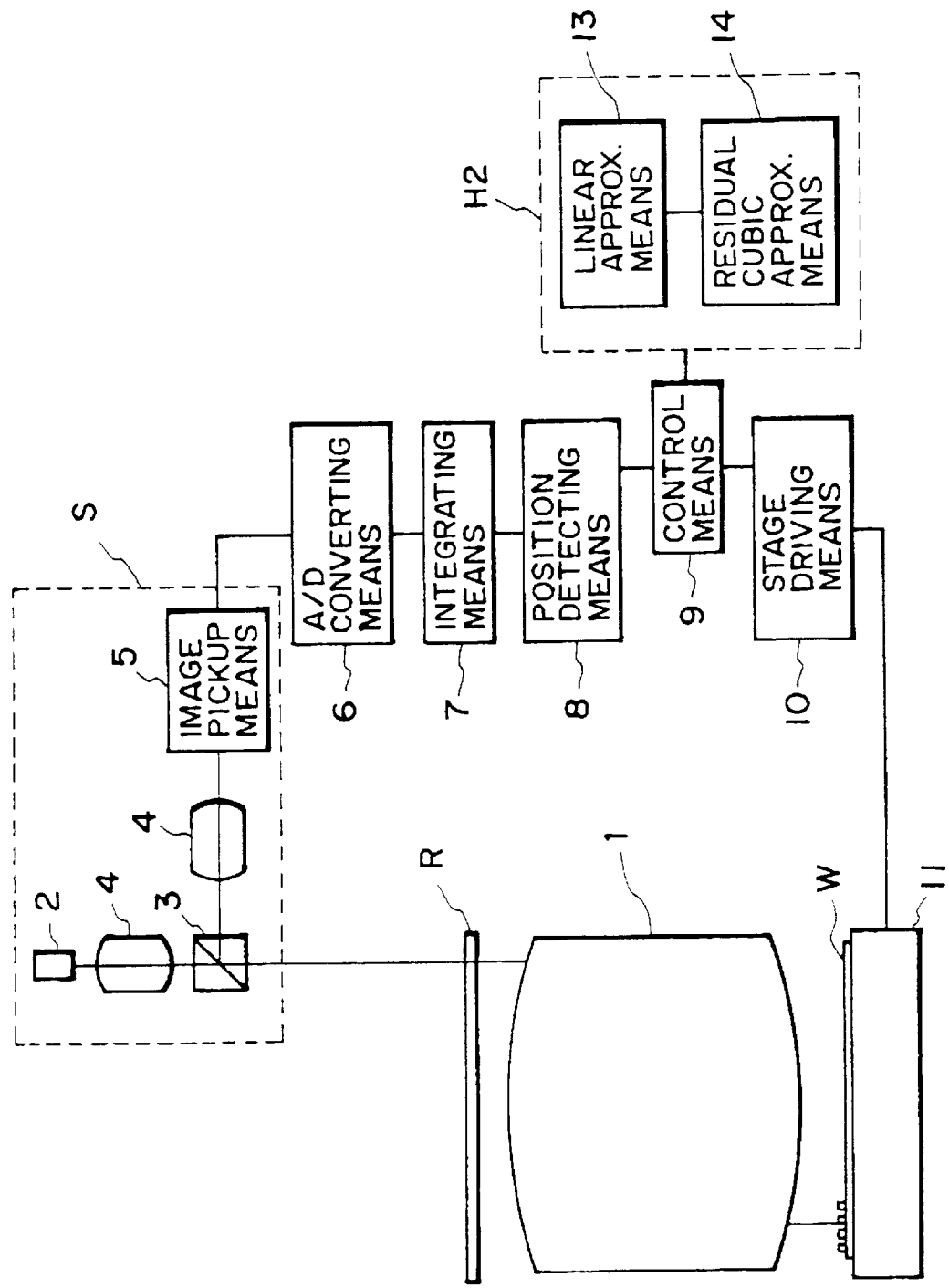
FIG. 7 is a schematic and diagrammatic view of general structure of a semiconductor exposure apparatus according to a second embodiment of the present invention.

FIG. 7 is a schematic view of a second embodiment of the present invention, wherein the invention is applied to a step-and-repeat type semiconductor manufacturing exposure apparatus. In this embodiment, the alignment procedure is performed so that error factors are subjected to first-order approximation and any remainder is subject to third-order approximation. This ensures reduction of calculation amount while retaining high alignment precision.

Denoted in FIG. 7 at 13 is a first-order approximation means, and denoted at 14 is a remainder third-order approximation means. Denoted at H2 is a correction formula producing means which include these approximation means therein. The structure and function of the remaining portion of the system are substantially the same as those of the first embodiment. Also, the integrating means 7, the position detecting means 8, the control means 9 and the correction formula producing means H2 may be provided by functions of a board computer or a general purpose computer, and a common system may be used for them. Of course, separate electronic circuit devices may be used exclusively for them.

Figure 8:
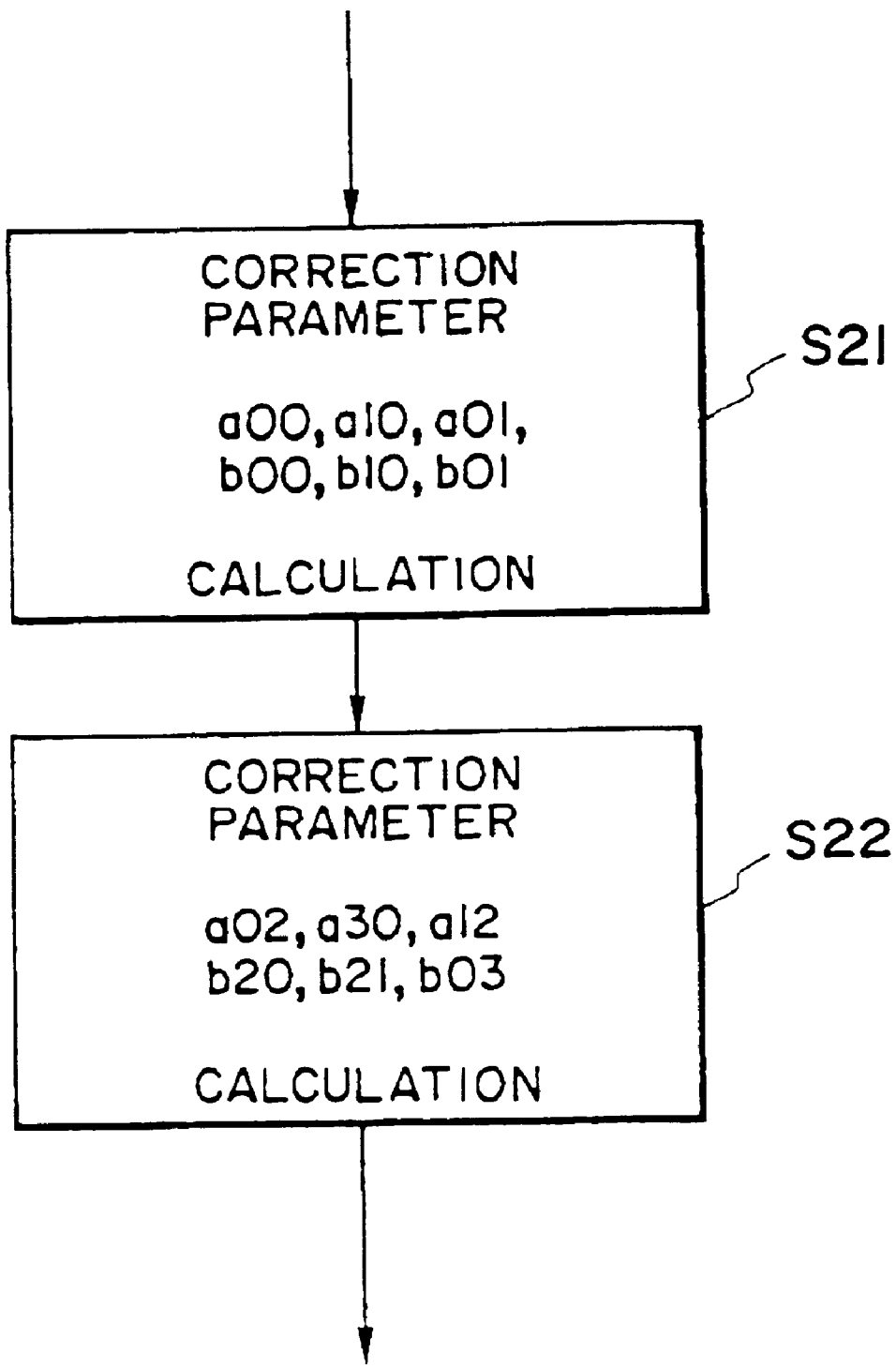
FIG. 8 is a schematic and diagrammatic view for explaining an example of procedure for correction formula determination, in the apparatus of FIG. 7.

Now, the procedure of relative alignment of a reticle R and a wafer W and exposure of them, in the apparatus of FIG. 7, will be described. In the apparatus of FIG. 7, like the first embodiment, alignment and exposure procedure can be performed in accordance with a global alignment method, with the sequential processes shown in FIG. 2. However, as regards step S5 of FIG. 2, the operation in this embodiment is to be performed as illustrated in FIG. 8. Thus, referring first to FIG. 8, the process of step 5 in FIG. 2 will be explained.

At step S21 of FIG. 8, the first-order approximation means 13 functions to calculate correction parameters $a_{00}$, $a_{10}$, $a_{01}$, $b_{00}$, $b_{10}$ and $b_{01}$, on the basis of mark design positions $(x_i, y_i)$ of measurement shots, being specified beforehand, and of positional deviations $(d_{xi}, d_{yi})$ of the measurement shots having been measured at step S3, and in accordance with equation (6). These parameters as determined are applied to the control means 9 and the remainder third-order approximation means 14.

At step S22, the remainder third-order approximation means 14 operates to determine correction parameters $a_{02}$, $a_{30}$, $a_{12}$, $b_{20}$, $b_{21}$ and $b_{03}$, in accordance with equation (13) and on the basis of design mark positions $(x_i, y_i)$ of measurement shots being specified beforehand, of positional deviations $(d_{xi}, d_{yi})$ of the measurement shots having been measured at step S3, and of the correction parameters $a_{00}$, $a_{10}$, $a_{01}$, $b_{00}$, $b_{10}$ and $b_{01}$ having been determined at step S3. The thus calculated parameters are applied to the control means 9.

By executing the alignment procedure on the basis of first-order approximation to error factors and of subsequent third-order approximation to remainder, as described above, reduction of calculation amount is attainable while retaining high alignment precision.

Figure 9:
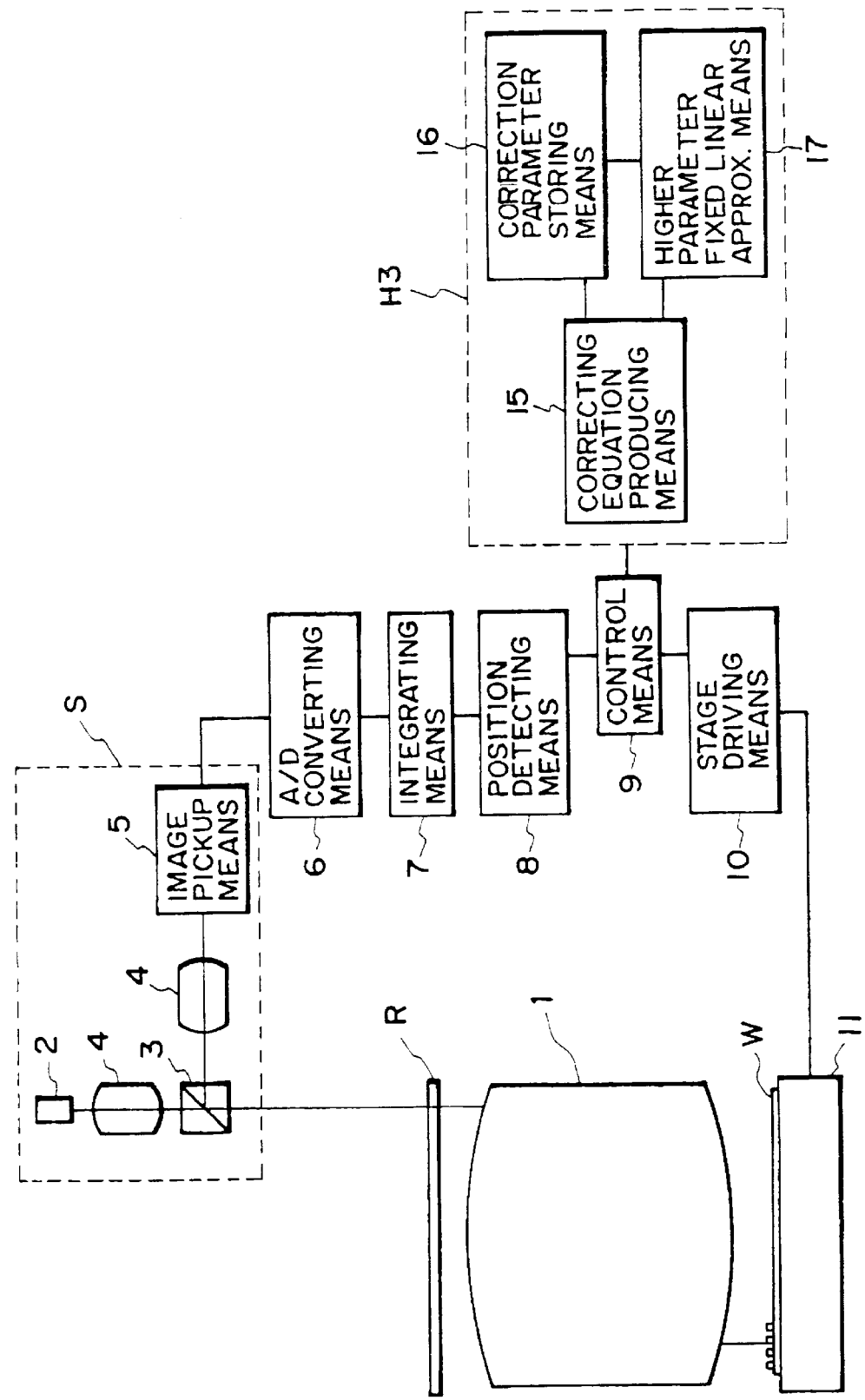
FIG. 9 is a schematic and diagrammatic view of general structure of a semiconductor exposure apparatus according to a third embodiment of the present invention.

FIG. 9 is a schematic view of a third embodiment of the present invention, in which the invention is applied to a step-and-repeat type semiconductor manufacturing exposure apparatus. In this embodiment, correction parameters as calculated with respect to the first few wafers are used for the remaining wafers, this being intended for further reduction of calculation amount while retaining high alignment precision.

Denoted in FIG. 9 at 15 is a correction formula producing means corresponding to the correction formula producing means H1 of the first embodiment or the correction formula producing means H2 of the second embodiment. Denoted at 16 is a correction parameter storing means, and denoted at 17 is a high-order correction parameter fixed first-order approximation means. Denoted at H3 is a correction formula producing means which includes the above-described components. The structure and operation of the remaining portion of this embodiment are essentially the same as those of the first embodiment. Also, the integrating means 7, the position detecting means 8, the control means 9 and the correction formula producing means H3 may be provided by functions of a board computer or a general purpose computer, and a common system may be used for them. Of course, separate electronic circuit devices may be used exclusively for them.

Figure 10:
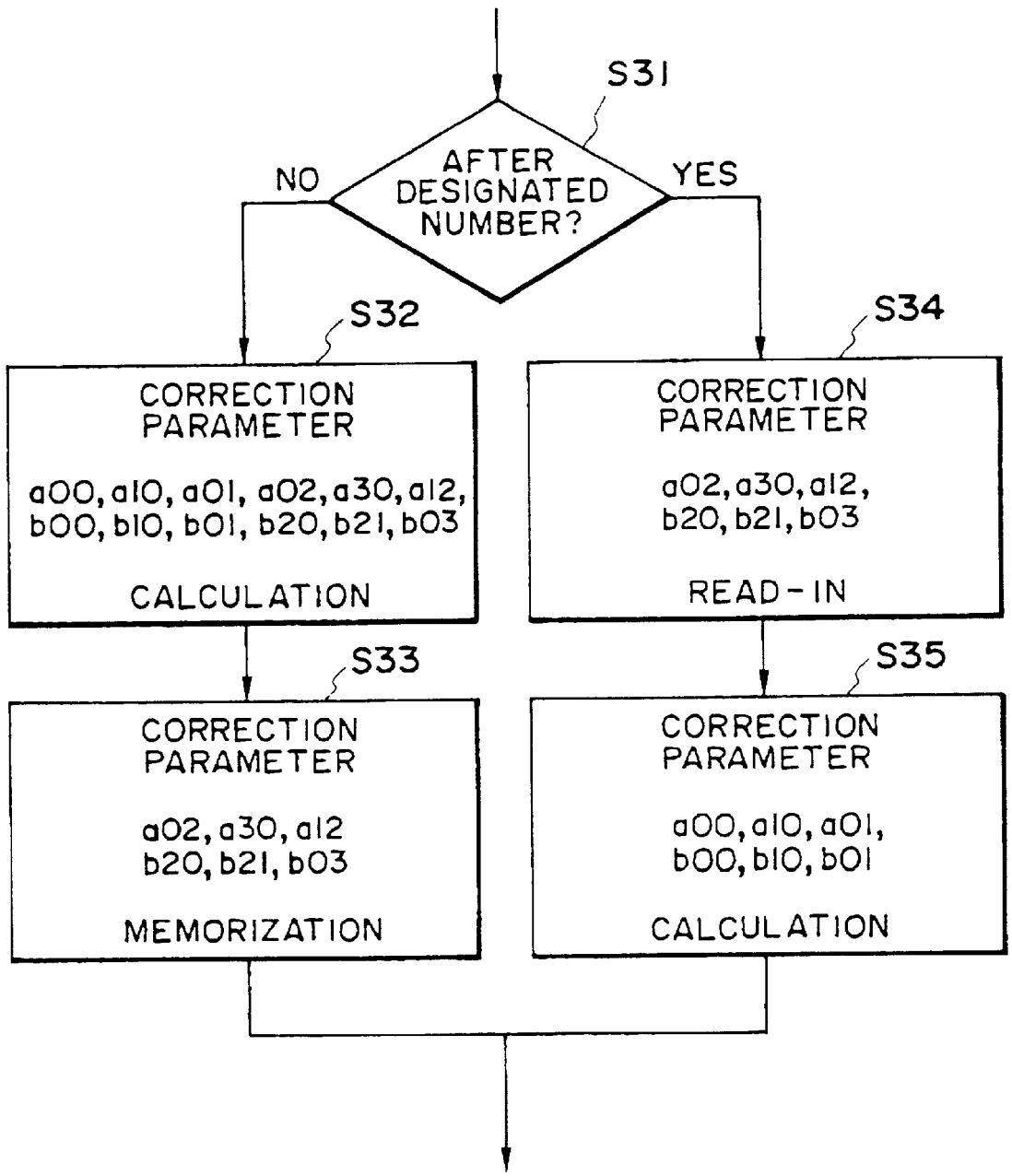
FIG. 10 is a flow chart for explaining an example of procedure of correction formula determination, in the apparatus of FIG. 9.

Now, the procedure of relative alignment of a reticle R and a wafer W and exposure of them, in the apparatus of FIG. 9, will be described. In the apparatus of FIG. 9, like the first embodiment, alignment and exposure procedure can be performed in accordance with a global alignment method, with the sequential processes shown in FIG. 2. However, as regards step S5 of FIG. 2, the operation in this embodiment is to be performed as illustrated in FIG. 10. Thus, referring first to FIG. 10, the process of step 5 in FIG. 2 will be explained.

At step S31 in FIG. 10, discrimination is made as to whether a current wafer just to be exposed is after a designated number of wafers (not less than 2). If not, the sequence goes to step S32. If it is after the designated number, the sequence goes to step S34.

At step S32 in FIG. 10, like step S5 of FIG. 2 with reference to the first embodiment or like step S5 with reference to the second embodiment, the correction formula producing means 15 calculates correction parameters $a_{00}$, $a_{10}$, $a_{01}$, $a_{02}$, $a_{30}$, $a_{12}$, $b_{00}$, $b_{10}$, $b_{01}$, $b_{20}$, $b_{21}$ and $b_{03}$, on the basis of design mark positions $(x_i, y_i)$ of measurement shots, being specified beforehand, and of positional deviations $(d_{xi}, d_{yi})$ of the measurement shots having been measured at step S3. The calculated parameters are applied to the control means 9. Additionally, the parameters $a_{02}$, $a_{30}$, $a_{12}$, $b_{20}$, $b_{21}$ and $b_{03}$ are applied to the correction parameter storing means 16.

At step S33 in FIG. 10, those parameters $a_{02}$, $a_{30}$, $a_{12}$, $b_{20}$, $b_{21}$ and $b_{03}$ as determined at step S32 are memorized into the correction parameter storing means 16.

At step S34 in FIG. 10, the parameters $a_{02}$, $a_{30}$, $a_{12}$, $b_{20}$, $b_{21}$ and $b_{03}$ are read out of the correction parameter storing means 16 and, if averages of high-order correction parameters, as below, are already detected by calculation, they are applied to the high-order correction parameter fixed first-order approximation means 17.

$$\overline{a_{02}}, \overline{a_{30}}, \overline{a_{12}}, \overline{b_{20}}, \overline{b_{21}}, \overline{b_{03}}$$

If averages of high-order correction parameters are not yet calculated, they are calculated in accordance with equation (15) and memorized, and then they are applied to the high-order correction parameter fixed first-order approximation means 17.

At step S35 in FIG. 10, the high-order parameter fixed first-order approximation means 17 calculates correction parameters $a_{00}$, $a_{10}$, $a_{01}$, $b_{00}$, $b_{10}$ and $b_{01}$ in accordance with equation (17) and on the basis of design mark positions $(x_i, y_i)$ of measurement shots, specified beforehand, of positional deviations $(d_{xi}, d_{yi})$ of the measurement shots having been measured at step S3, and of the averages $\overline{a_{02}}, \overline{a_{30}}, \overline{a_{12}}, \overline{b_{20}}, \overline{b_{21}}$ and $\overline{b_{03}}$ determined at step S34. The thus determined correction parameters are applied to the control means 9.

By using correction parameters having been calculated with respect to the first few wafers, to the remaining wafers, as described, further reduction of calculation amount is attainable while retaining high alignment precision.

Figure 11:
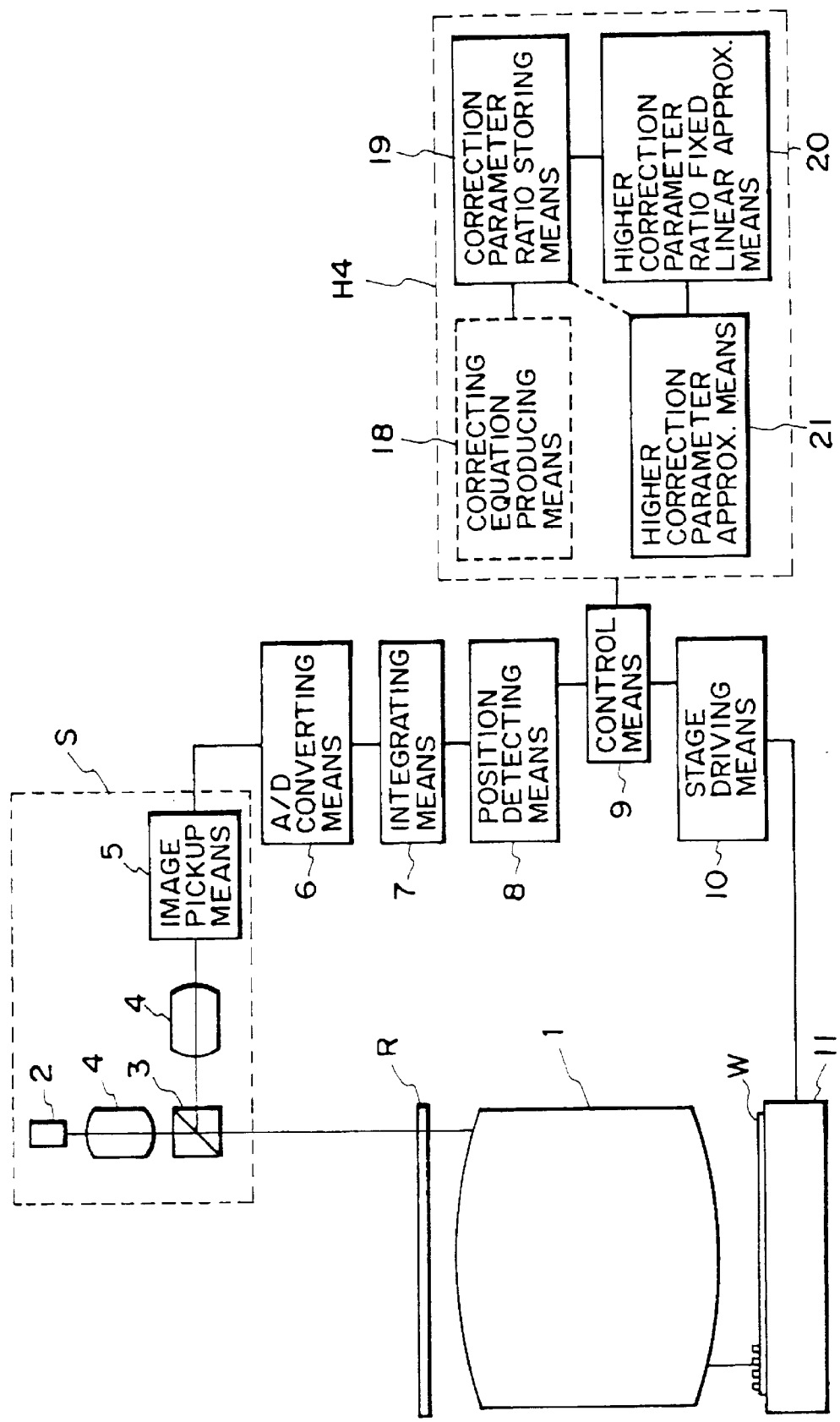
FIG. 11 is a schematic and diagrammatic view of general structure of a semiconductor exposure apparatus according to a fourth embodiment of the present invention.

FIG. 11 is a schematic view of a fourth embodiment of the present invention, in which the invention is applied to a step-and-repeat type semiconductor manufacturing exposure apparatus. In this embodiment, a correction parameter ratio having been calculated with respect to the first few wafers is used for the remaining wafers, this being intended for further reduction in calculation amount while holding high alignment precision.

Denoted in FIG. 11 at 18 is a correction formula producing means corresponding to the correction formula producing means H1 of the first embodiment or the correction formula producing means H2 of the second embodiment. Denoted at 19 is a correction parameter ratio storing means, and denoted at 20 is a high-order correction parameter ratio fixed first-order approximation means. Denoted at 21 is a high-order correction parameter approximation means, and denoted at H4 is a correction formula producing means which includes the above-described components. The structure and operation of the remaining portion of this embodiment are essentially the same as those of the first embodiment. Also, the integrating means 7, the position detecting means 8, the control means 9 and the correction formula producing means H3 may be provided by functions of a board computer or a general purpose computer, and a common system may be used for them. Of course, separate electronic circuit devices may be used exclusively for them.

Figure 12:
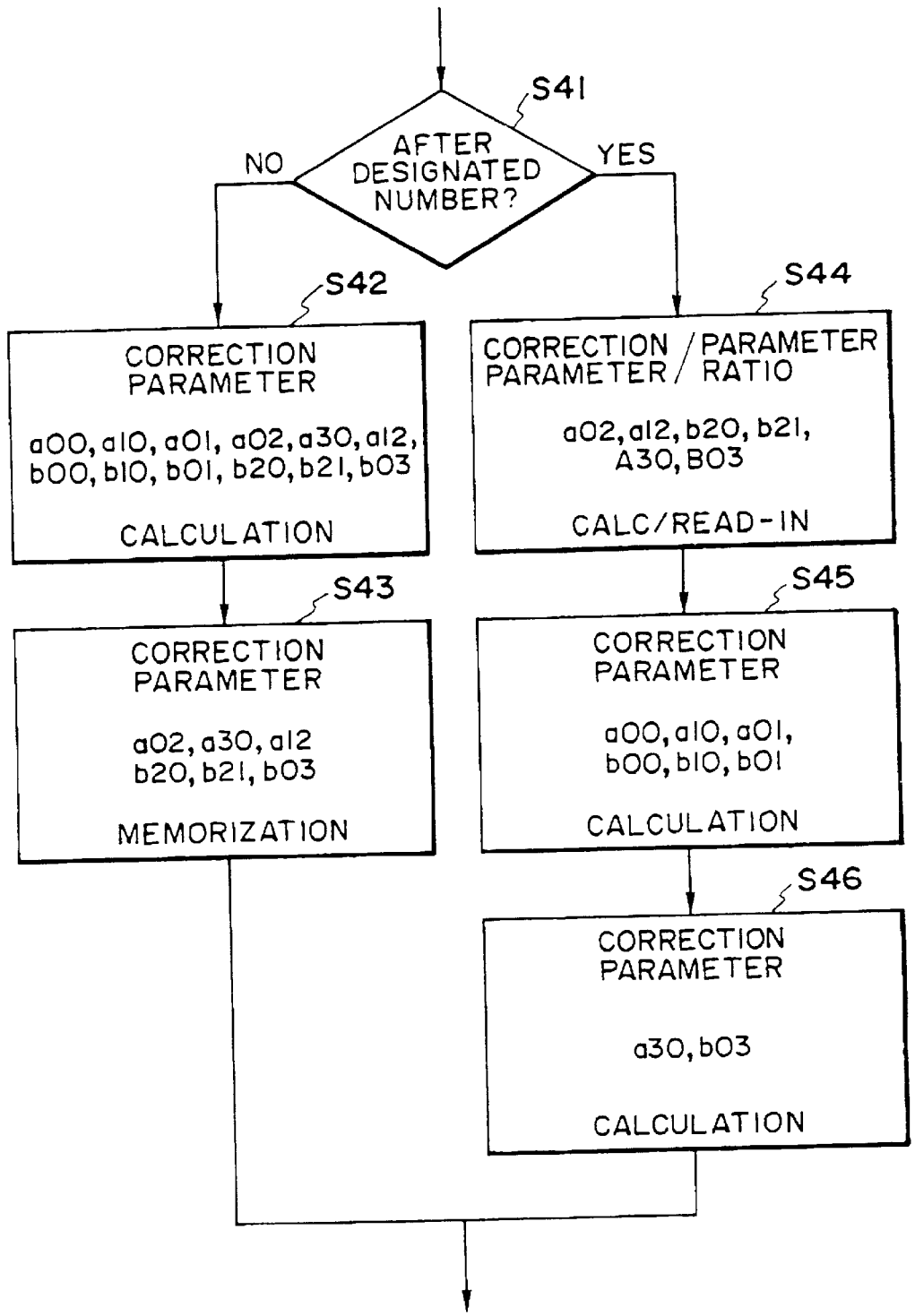
FIG. 12 is a flow chart for explaining an example of procedure of correction formula determination, in the apparatus of FIG. 11.

Now, the procedure of relative alignment of a reticle R and a wafer W and exposure of them, in the apparatus of FIG. 11, will be described. In the apparatus of FIG. 11, like the first embodiment, alignment and exposure procedure can be performed in accordance with a global alignment method, with the sequential processes shown in FIG. 2. However, as regards step S5 of FIG. 2, the operation in this embodiment is to be performed as illustrated in FIG. 12. Thus, referring first to FIG. 12, the process of step 5 in FIG. 2 will be explained.

At step S41 in FIG. 12, discrimination is made as to whether a current wafer just to be exposed is after a designated number of wafers (not less than 2). If not, the sequence goes to step S42. If it is after the designated number, the sequence goes to step S44.

At step S42 in FIG. 12, like step S5 of FIG. 2 with reference to the first embodiment or like step S5 with reference to the second embodiment, the correction formula producing means 18 calculates correction parameters $a_{00}$, $a_{10}$, $a_{01}$, $a_{02}$, $a_{30}$, $a_{12}$, $b_{00}$, $b_{10}$, $b_{01}$, $b_{20}$, $b_{21}$ and $b_{03}$, on the basis of design mark positions $(x_i, y_i)$ of measurement shots, being specified beforehand, and of positional deviations $(d_{xi}, d_{yi})$ of the measurement shots having been measured at step S3. The calculated parameters are applied to the control means 9. Additionally, the parameters $a_{10}$, $a_{01}$, $a_{02}$, $a_{30}$, $a_{12}$, $b_{10}$, $b_{01}$, $b_{20}$, $b_{21}$ and $b_{03}$ are applied to the correction parameter ratio storing means 19.

At step S43 in FIG. 12, those parameters $a_{10}$, $a_{01}$, $a_{02}$, $a_{30}$, $a_{12}$, $b_{10}$, $b_{01}$, $b_{20}$, $b_{21}$ and $b_{03}$ as determined at step S42 are memorized into the correction parameter ratio storing means 19.

At step S44 in FIG. 12, correction parameters $a_{10i}$, $a_{01i}$, $a_{02i}$, $a_{30i}$, $a_{12i}$, $b_{10i}$, $b_{01i}$, $b_{20i}$, $b_{21i}$ and $b_{03i}$ are read out of the correction parameter ratio storing means 19 and, if averages of high-order correction parameters, as below, and high-order correction parameter ratios $A_{30}$ and $B_{03}$ are already determined by calculations, they are applied to the high-order correction parameter ratio fixed first-order approximation means 20.

$$\overline{a_{02}}, \overline{a_{12}}, \overline{b_{20}}, \overline{b_{21}}$$

If averages of high-order correction parameters or parameter ratios are not yet calculated, they are calculated in accordance with equation (15) or (19) and memorized, and then they are applied to the high-order parameter ratio fixed first-order approximation means 20 and the high-order correction parameter calculating means 21.

At step S45 in FIG. 12, the high-order correction parameter ratio fixed first-order approximation means 20 calculates correction parameters $a_{00}$, $a_{10}$, $a_{01}$, $b_{00}$, $b_{10}$ and $b_{01}$ in accordance with equation (21) and on the basis of design mark positions $(x_i, y_i)$ of measurement shots, specified beforehand, of positional deviations $(d_{xi}, d_{yi})$ of the measurement shots having been measured at step S3, and of the averages $\overline{a_{02}}$, $\overline{a_{12}}$, $\overline{b_{20}}$, and $\overline{b_{21}}$ of high-order correction parameters determined at step S44. The thus determined correction parameters are applied to the control means 9 and the high-order correction parameter calculating means 21.

As step S46 in FIG. 12, the high-order parameter calculating means 21 operates to take the averages $\overline{a_{02}}$, $\overline{a_{12}}$, $\overline{b_{20}}$, and $\overline{b_{21}}$ of high-order correction parameters as the values of parameters $a_{02}$, $a_{12}$, $b_{20}$, and $b_{21}$. Also, in accordance with equation (23) below and on the basis of the high-order correction parameter ratios $A_{30}$ and $B_{03}$, the high-order parameter calculating means 21 calculates correction parameters $a_{30}$ and $b_{03}$ and applies them to the control means 9.

$$a_{30} = A_{30} a_{10}$$
$$b_{03} = B_{03} b_{01} \tag{23}$$

By using correction parameter ratios having been calculated with respect to first few wafers, to the remaining wafers, as described, further reduction of calculation amount is attainable while retaining high alignment precision.

While the invention has been described with reference to the structures disclosed herein, it is not confined to the details set forth and this application is intended to cover such modifications or changes as may come within the purposes of the improvements or the scope of the following claims.

What is claimed is:

1. An alignment method, comprising the steps of:

measuring a deviation between a design position and a measurement position, with respect to some of plural alignment execution points upon an object, to be examined, which alignment execution points have predetermined design positions, respectively;

applying design positions of some alignment execution points and measured positional deviations to an approximation formula which approximates the relation between design positions and corrected positional deviations, and determining, with respect to each alignment execution point, a correction formula for calculating a corrected positional deviation on the basis of its design position; and performing an alignment procedure to be done with respect to the alignment execution points in accordance with the determined correction formula, wherein the correction formula includes a second or higher order term of design position.

2. A method according to claim 1, wherein, in determination of a correction formula, design positions of said some alignment execution points and measured positional deviations are applied to an approximation formula including a second or higher order term of design position, whereby a correction formula including a second or higher order term of design position is prepared.

3. A method according to claim 1, wherein, in determination of a correction formula, design positions of said some alignment execution points and measured positional deviations are applied to an approximation formula consisting of first or lower order terms of design position, and remaining approximation differences of it are applied to an approximation formula consisting of second or higher order terms of design position, whereby a correction formula including a second or higher order term of design position is prepared.

4. A method according to claim 1, wherein, in determination of a correction formula, design positions of said some alignment execution points and measured positional deviations are applied to an approximation formula which consists of first or lower order terms of design position and in which coefficients of second or higher terms of design position in the first-mentioned approximation formula are taken as being coefficients or an average of them of corresponding terms of a correction formula having been determined with respect to the same system, whereby a correction formula including a second or higher order term of design position is prepared.

5. A method according to claim 1, wherein, in determination of a correction formula, design positions of said some alignment execution points and measured positional deviations are applied to an approximation formula which consists of first or lower order terms of design position and in which a coefficient ratio between a second or higher order term and a first order term of design position of the first-mentioned approximation formula is taken as being similar coefficients or an average of them of a correction formula having been determined with respect to the same system, whereby a correction formula including a second or higher order term of design position is prepared.

6. A method according to claim 1, wherein, when a design position is denoted by (x, y), when a corrected positional deviation is denoted by ($d'_x$, $d'_y$) and when coefficients of respective terms are denoted by $a_{00}$, $a_{10}$, $a_{01}$, $a_{30}$, $a_{12}$, $b_{00}$, $b_{10}$, $b_{01}$, $b_{21}$, and $b_{03}$, respectively, a correction formula is given by:

$$d'_x = a_{00} + a_{10}x + a_{01}y + a_{02}y^2 + a_{30}x^3 + a_{12}xy^2$$

$$d'_y = b_{00} + b_{10}x + b_{01}y + b_{20}x^2 + b_{21}x^2y + b_{03}y^3.$$

7. A method according to claim 1, wherein, in determination of a correction formula, a normal equation of an approximation formula is solved in accordance with a least square method, on the basis of which design positions of said some alignment execution points and measured positional deviations are applied to the approximation formula.

8. A method according to claim 1, wherein the object to be examined is a substrate on which a pattern of an original is to be lithographically printed by using an exposure apparatus, wherein alignment execution points are exposure positions on the substrate, and wherein each exposure position is to be aligned with respect to the original.

9. A method according to claim 8, wherein those error components of the substrate in the exposure apparatus which are X-direction translation component $a_{00}$, X scale $a_{10}$, Y-axis rotation $a_{01}$, Y-axis arch $a_{02}$, third-order magnification $a_{30}$, third-order magnification $a_{12}$, Y-direction translation component $b_{00}$, X-axis rotation $b_{10}$, Y scale $b_{01}$, X-axis arch $b_{20}$, third-order magnification $b_{21}$, and third-order magnification $b_{03}$, are taken as coefficients of terms of the correction formula.

10. An alignment system, comprising:

position measuring means for measuring a deviation between a design position and a measurement position, with respect to some of plural alignment execution points upon an object, to be examined, which alignment execution points have predetermined design positions, respectively;

correction formula determining means for applying design positions of some alignment execution points and measured positional deviations to an approximation formula which approximates the relation between design positions and corrected positional deviations, and for determining, with respect to each alignment execution point, a correction formula for calculating a corrected positional deviation on the basis of its design position; and alignment performing means for performing an alignment procedure to be done with respect to the alignment execution points in accordance with the determined correction formula, wherein the correction formula includes a second or higher order term of design position.

11. A system according to claim 10, wherein the object to be examined is a substrate on which a pattern of an original is to be lithographically printed by using an exposure apparatus, wherein alignment execution points are exposure positions on the substrate, and wherein each exposure position is to be aligned with respect to the original.

* * * * *

UNITED STATES PATENT AND TRADEMARK OFFICE
CERTIFICATE OF CORRECTION

PATENT NO. : 5,986,766

DATED : November 16, 1999

INVENTORS : SHINICHIRO KOGA, ET AL.

It is certified that error appears in the above-identified patent and that said Letters Patent is hereby corrected as shown below:

ON THE COVER PAGE:
   item "[22]" (Filing Date): "Feb. 6, 1997" should read --Feb. 7, 1997--.

IN THE DISCLOSURE:
COLUMN 1:
Line 32, "as" should be deleted.

COLUMN 5:
Line 17, "$b_{nm}$" should read --$b_{nm}$--.

COLUMN 7:
Line 20, "$b_{02}$" should read --$b_{20}$--.

Signed and Sealed this

Nineteenth Day of September, 2000

Attest:

Q. TODD DICKINSON

*Attesting Officer*    *Director of Patents and Trademarks*